US006518771B2

(12) United States Patent
Frotscher et al.

(10) Patent No.: US 6,518,771 B2
(45) Date of Patent: Feb. 11, 2003

(54) METHOD OF MONITORING THE CONTACT BURNOFF IN TAP CHANGERS

(75) Inventors: Rainer Frotscher, Regenstauf (DE); Dieter Dohnal, Lappersdorf (DE)

(73) Assignee: Pharmacia & Upjohn Company, Kalamazoo, MI (US)

( * ) Notice: Subject to any disclaimer, the term of this patent is extended or adjusted under 35 U.S.C. 154(b) by 0 days.

(21) Appl. No.: 09/772,289

(22) Filed: Jan. 29, 2001

(65) Prior Publication Data

US 2001/0013784 A1 Aug. 16, 2001

(30) Foreign Application Priority Data

Jan. 29, 2000 (DE) ........................................ 100 03 918

(51) Int. Cl.[7] ........................ G01R 31/12; G01R 31/02; H01H 19/58

(52) U.S. Cl. .................... 324/547; 324/421; 200/11 TC

(58) Field of Search ................................ 324/547, 421, 324/726, 424; 200/11 TC; 323/340, 343, 258

(56) References Cited

U.S. PATENT DOCUMENTS 4,491,797 A * 1/1985 Velsher ....................... 324/415
6,100,674 A * 8/2000 Dohnal et al. .............. 323/256

FOREIGN PATENT DOCUMENTS

| | | |
|---|---|---|
| DE | 27 27 378 | 1/1979 |
| DE | 35 15 027 | 10/1985 |
| DE | 40 28 721 | 5/1995 |
| DE | 44 27 006 | 2/1996 |
| DE | 195 30 776 | 12/1996 |
| DE | 195 44 926 | 4/1997 |
| DE | 296 19 365 | 4/1998 |
| EP | 0 948 006 | 10/1999 |
| JP | 7 123086 | 12/1995 |
| WO | 96/13732 | 5/1996 |
| WO | 97/28549 | 8/1997 |

* cited by examiner

*Primary Examiner*—N. Le
*Assistant Examiner*—James Kerveros

(57) ABSTRACT

A method of monitoring contact burnoff in tap changers operating under load in which the load current is measured and for nominal variation of the voltage of the particular tap parameters are stored which are used to calculate the burnoff rate per contact per switching operation. From these values the cumulative burnoff rate of both the switching contact and resistance contact are determined and compared with limits or threshold values.

4 Claims, 4 Drawing Sheets

CONTINUED ON FIG. 1A

METHOD OF MONITORING THE CONTACT BURNOFF IN TAP CHANGERS

FIELD OF THE INVENTION

Our present invention relates to a method of monitoring the contact burnoff of a tap changer and especially the burnoff of contacts which tend to arc in tap changers.

BACKGROUND OF THE INVENTION

Tap changers have been used for a considerable time for the uninterrupted switching between taps of a tap transformer in electrical power distribution and such tapped transformers and their tap changers are utilized in large number throughout the world. The tap changer is utilized to select the transformer winding which is to be effective and has been designed to allow such switching under load. The tap changer for tap selection under load generally comprises switching contacts and resistance contacts. The switching contacts can directly connect the particular tap and section of the transformer winding, with the lines running to the load. The resistance contacts are briefly connected in circuit and bridge resistance into the circuit to allow uninterrupted tap selection under load. In recent years the tap changer could be equipped with thyristors (electronic switch devices) and vacuum switch cells as the switching elements but by far the greatest number of tap changers in use today and in the near future utilize mechanical contacts which are subject to burn off by the switching arc which may be formed.

To minimize the contact burnoff, the switching contacts and the resistance contacts can be composed of arc-resistant copper-tungsten alloys. Nevertheless, upon switchover of the contacts arcs are generated which can melt small quantities of the contact material and cause burnoff and evaporation of some of the contact material. The result is a contact burnoff which is an important criterium in the maintenance and operation of a tap changer. The contacts in the past have been frequently inspected and determinations as to burnoff have been made. The burnoff in the switching and resistance contacts is a significant consideration in the operation of the tap changer. If the contacts burn off at different rates, the switching and overlapping or bridging intervals of the individual switching steps can vary within the sequence in a tap changing operation so that the tap changer if the contacts burn off at different rates, the switching and overlapping or bridging intervals of the individual switching function can become unreliable. In general, the burnoff will have a maximum permissible burnoff difference or burnoff limit. If these values are exceeded the contacts must be replaced by new contacts or the resistance contacts and the switching contacts must be interchanged. When contacts are completely burned off, they must be replaced immediately.

There are numerous processes available for contact burnoff or contact wear monitoring whereby the residual life of a contact or some other similar factor can be reviewed for switching contacts and tap changers or other high voltage switching contacts. These can be considered in different groups.

For example, DE-GM 296 19 365 and EP 0 948 006 provide a purely optical process for determining residual life or burnoff state.

DE-OS 35 15 027 and DE-PS 40 28 721 describe processes in which the arc current between the contacts is determined and is used as a criterium for the burnoff.

DE-PS 195 44 926 describes a process in which the arc voltage is used.

DE-OS 44 27 006 describes a process in which the contact pressure of the switching element is utilized as a criterium of contact burnoff. WO 97/28549 describes a process for monitoring the switch movements, i.e. the timed sequence in tap selection or tap changing.

In WO 96/13732 a process has been described for monitoring the insulation breakdown criterium for a switch contact subject to wear, utilizing an additional signal line.

Japanese open application Hei-4-64206 describes a process utilizing a calculation which is a function of the number of switchovers carried out by a tap changer.

Reference may also be had to DE 195 30 776 C1 which discloses a process for monitoring a tap changer operable under load whereby during the switching under load, the arc which is formed is detected from time to time and by comparison of the times between the individual arcs or by comparison of the durations of the length of the individual arc with respect setpoint values as characteristic values for the tap changer, a determination of the contact burnoff can be obtained. The determination is indirect and when the life of the contacts is exceeded, i.e. the burnoff has progressed beyond a permissible limit, the replacement can be undertaken. A direct detection of burnoff or monitoring is not however possible.

DE-OS 27 27 378 describes a device for monitoring operation of a tap changer in a general way in which the burnoff is determined by a load current measurement utilizing a current converter. In many cases this system is not suitable for certain tap changers.

By and large the processes described above have not found widespread use with tap changers for a variety of reasons. Direct optical and mechanical techniques are not practical because of the location of the contacts to be monitored in the interior of the tap changer, i.e. usually in an oil bath. Processes which require additional measuring conductors to run into the region of the contacts in the tap chamber are also not suitable since the passage of these converters through the tap changer wall reduces the breakdown voltage of the housing and the system. Processes which utilize the arc current, the arc voltage or the number of switching operations have generally been found to be insufficiently reliable.

OBJECTS OF THE INVENTION

It is therefore the principal object of the present invention to provide an improved process or method for monitoring contact burnoff in tap changers which can ensure in a reliable and simple manner a substantially exact measurement of the burnoff of the contact without requiring visual examination or direct measurements at the respective contacts and which can generate an output upon a contact burnoff exceeding a predetermined degree.

Another object of the invention is to provide a burnoff monitoring method which is free from the drawbacks of the prior art system mentioned previously and which does not adversely affect breakdown voltage of the tap changer.

It is also an object of this invention to provide a method of monitoring contact burnoff in the switching contacts and resistance contacts of a tap changer wherein the contacts which tend to arc can be submerged in oil.

SUMMARY OF THE INVENTION

These objects are attained, in accordance with the invention in a method of monitoring contact burnoff in a tap changer for a transformer having a multiplicity of taps, the method comprising the steps of:

(a) storing values of respective nominal tap voltages ($U_S$), a limiting value for the permissible contact burnoff for switching contacts and resistance contacts of the tap changer, and tap-changer-specific parameters a, b and k;

(b) detecting a current tap setting of the tap changer;

(c) incrementing an index n with each tap change by ($c_1$) stepping the tap changer to a selected tap, ($c_2$) measuring a respective load current ($J_L$) of the selected tap, and ($c_3$) reading out the permanently stored values for the nominal tap voltage ($U_S$) of the selected tap;

(d) calculating a switching current ($J_{SK}$) of the respective switching contacts and a switching current ($J_{WK}$) of the respective resistance contacts in accordance with the relationships:

$$J_{SK} = \frac{J_L}{ParSec}$$

$$J_{WK} = \frac{U_S + J_L \cdot \frac{R_0}{s_{res}}}{2 \cdot R_0}$$

wherein ParSec is a number of parallel sectors, $R_0$ is a magnitude of a bridging resistance of the tap changer for the selected tap and $s_{res}$ is a resulting current splitting;

(e) calculating the respective burnoff rates $A_{sk}$ of the respective switching contacts and $A_{wk}$ of the respective resistance contacts from the relationships:

$$A_{SK} = a \cdot J_{SK}^b$$

$$A_{WK} = a \cdot J_{WK}^b$$

(f) summing up the burnoff rates ($A_{sk}$) and ($A_{wk}$) to obtain total volume burnoffs ($GA_{SK}^n$)for the switching contacts and $GA_{wk}^n$ for the resistance contacts by the relationships:

$$GA_{wk}^n = GA_{wk}^{n-1} + A_{wk};$$

$$GA_{sk}^n = GA_{sk}^{n-1} + A_{sk};$$

(g) calculating the respective burnoffs in millimeters of contact thickness for the switching contacts. $GAd_{sk}^n$ and for the resistance contacts $GAd_{wk}^n$ over the respective contact areas F by the relationships:

$$GAd_{sk}^n = \frac{GA_{sk}^n}{F} \cdot k$$

$$GAd_{wk}^n = \frac{GA_{wk}^n}{F} \cdot k; \text{ and}$$

(h) comparing the values $G\overline{A}d_{sk}^n$ and $GAd_{wk}^n$ with the permanently stored limits and generating a report upon overstepping of the permanently stored limit or a percentage thereof.

According to a feature of the invention the respective burnoff rates ($A_{sk}$) and ($A_{wk}$) are obtained from the calculated switching currents ($J_{SK}$) and ($J_{WK}$) in accordance with the relationships:

$$A_{sk} = a \cdot J_{sk}^b \cdot s, \text{ and}$$

$$A_{wk} = a \cdot J_{wk}^b \cdot s,$$

where s is a safety margin.

The actual contact burnoff is measured after a large number of switchings and the corresponding actual volumetric contact burnoff is calculated to obtain a factor f by the relationship:

$$\frac{\text{volumetric burnoff}_{measured}}{\text{cumulative volumetric burnoff}_{calculated}} = f$$

and each respective burnoff rate is corrected in accordance with the relationship:

$$A_{new} = f \cdot A_{old},$$

whereby the respective corrected value ($A_{new}$) is then used for future calculations in the method.

The invention thus provides a system for determining the contact burnoff state of each contact from a respective burnoff rate A. The process steps are carried out, in accordance with the invention in a computer in which the characteristic parameters of the respective tap changer, whose contacts are to be monitored, are stored in a nonvolatile manner together with the burnoff limits, the exceeding of which results in a warning or other signal generation or alert.

As has already been indicated, the contact burnoff of the respective switching contact or resistance contact is determined in the volume unit of the contact material which is lost, for example in $mm^3$ from the specific burnoff rate. This burnoff rate A with the physical unit $mm^3$/switching operation, i.e. the volume unit per switching operation, is a parameter which is a function of the material from which the contact is constituted and the current carried by the contact. The burnoff rate is thus given by the relationship:

$$A\left[\frac{\text{mm}^3}{\text{switch operation}}\right] = a \cdot J^b$$

In this relationship J is a current which is switched by the respective tap changer. It is determined by the computer in a known manner from the actual load current of the transformer which is measured, the true voltage step between two neighboring winding taps between which the switchover is to be made and the configuration of the tap changer. The values a and b are tap- changer specific parameters which have been stored in a nonvolatile manner in the memory of the computer. The factor a lies in the range of $10^{-5}$ to $10^{-2}$. For a time M tap changer as manufactured by Maschinenfabrik Reinhausen GmbH of Regensburg, Germany, a is preferably $8.5 \cdot 10^{-5}$. The value of b is in the range of 0.8 to 2.2. For the aforementioned type M tap changer b is preferably 1.16.

The determination of the burnoff rate should be obtained within a tolerance band which permits reliable response by the user. It has been found that the contact burnoff is affected by certain unpredictable and difficult to calculate influences which can give rise to significant fluctuations. As a consequence in the determination of the burnoff rate, a safety factor s is introduced which can be of an amount 10 to 12%. This has been found to be sufficient to cover the variations which can arise in practice. Thus according to a feature of the invention the burnoff rate can be obtained from the following relationship:

$$A\left[\frac{\text{mm}^3}{\text{switch operation}}\right]=a\cdot J^b\cdot s$$

In this manner the burnoff rate is obtained with the built-in safety factor.

It is possible in accordance with the invention to increase the precision of the determination of the burnoff rate still further by eliminating the flat rate approach with the safety factor previously described by iteratively determining the burnoff rate. In that case, the actual contact burnoff is measured after a representative number of switching operations. This can be carried out in the framework of routine inspection. From the measured values, the actual volume burnoff per contact is obtained and compared with the calculated volume burnoff to provide the correction factor f previously described. In that case, the calculation utilizes the following relationship:

$$A\left[\frac{\text{mm}^3}{\text{switching operation}}\right]=f\cdot a\cdot J^b\cdot s$$

The computer determination of the burnoff rate A according to the invention is integrated in a method of monitoring the contact burnoff. The process of the invention thus not only covers the calculation of the burnoff rate A but also the subsequent determination of the cumulative contact burnoff at each respective switching contact as well as the generation of any warning or other signal which is required by the situation.

A special advantage of the invention is that the monitoring of the contact burnoff of the contacts in the tap changer can be carried out in a simple manner without the need for access to the contacts themselves to view or measure them in any way. A further advantage of the invention is that the invention can be implemented in a complex tap changer and/or transformer monitoring system directly. The process of the invention allows the need for replacement of the contacts to be reliably determined. It avoids premature contact replacement which may be unnecessary and costly, and also prevents delay in contact replacement when the latter is necessary and thereby avoids the interruptions in function and difficulty in the replacement when the same is necessary.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
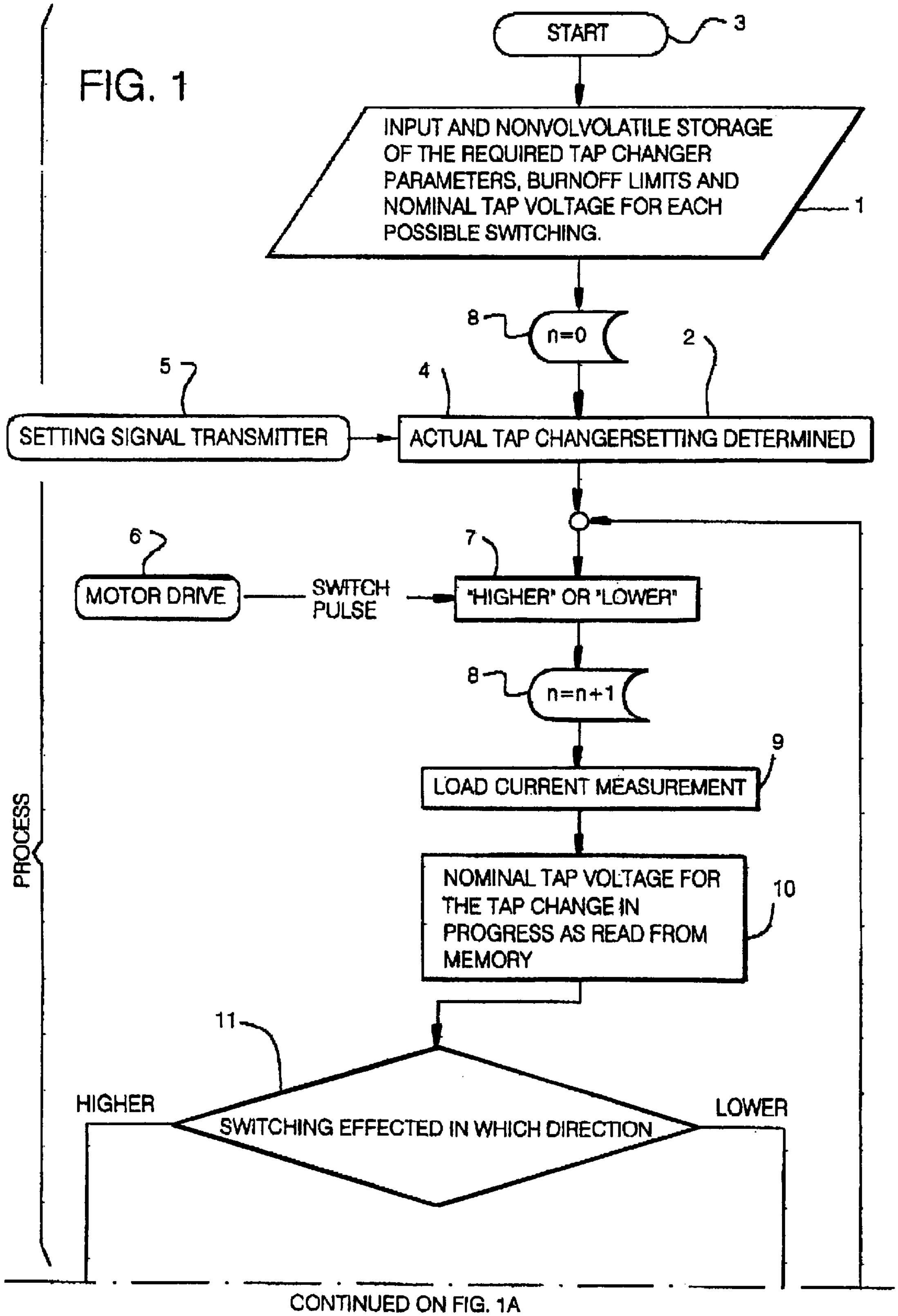
FIG. 1 is a diagram of the algorithm and method of the invention as implemented automatically, i.e. in a computer.
Figure 1A:
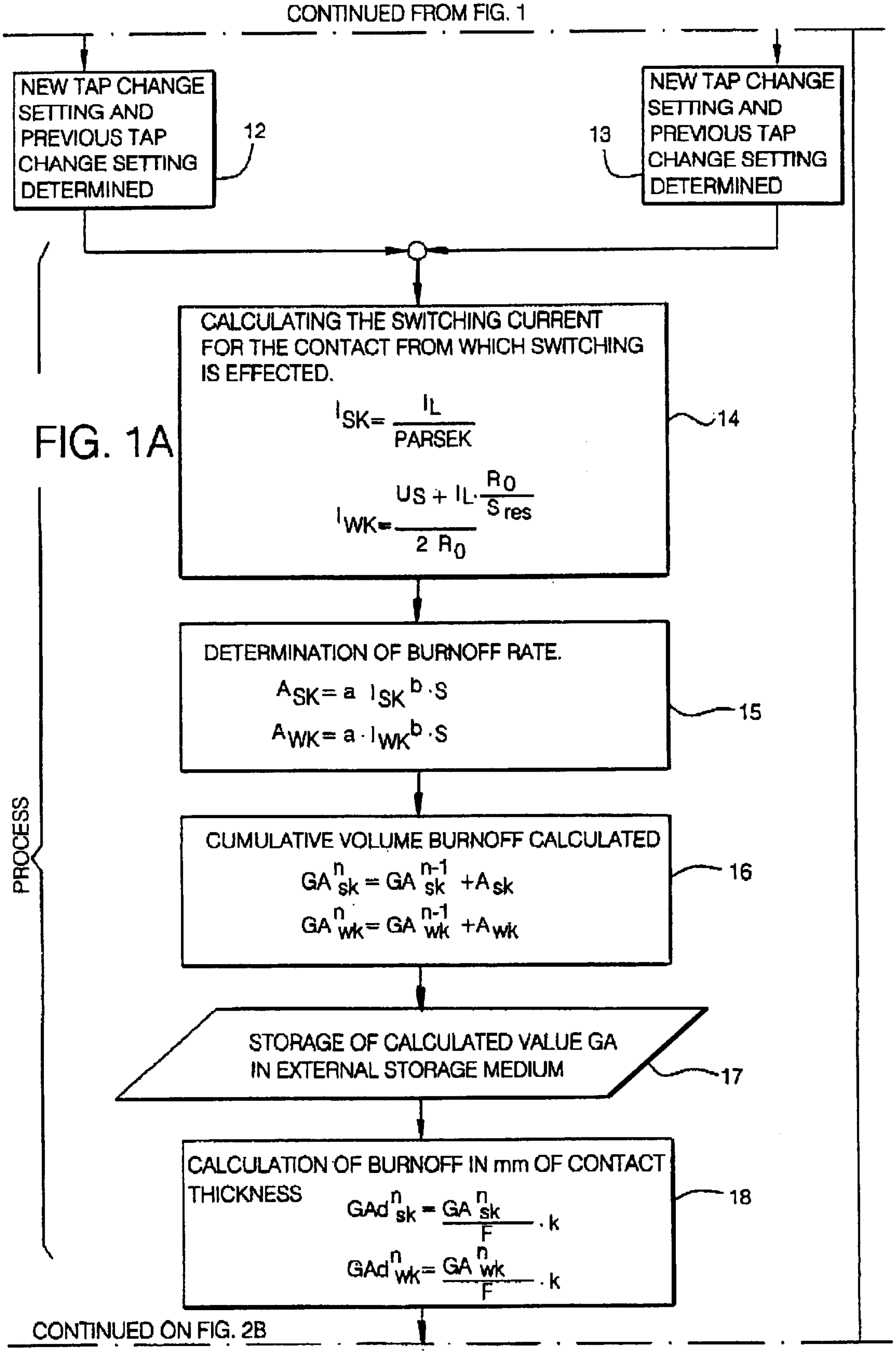
Figure 1B:
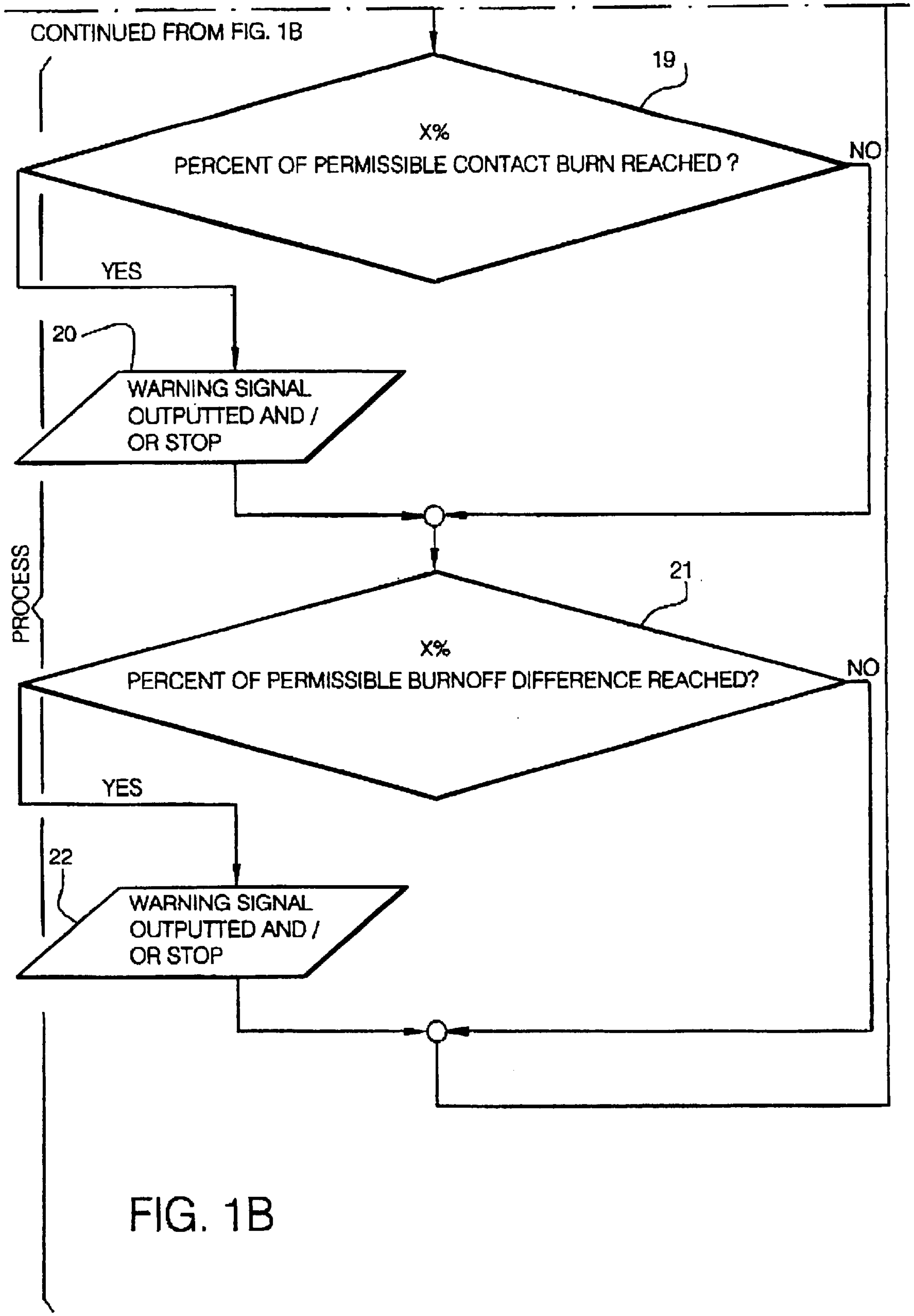

From FIG. 1 which serves to illustrate the method of the invention it can be seen that the first major operation of the method is the inputting of nonvolatile storage of specific tap changer parameters or requirements, the respective permissible burnoff limits for the individual contacts as well as the nominal tap voltages for each tap change or operation of the tap changer at 1. In this first step an initialization is effected, i.e. a matching of the system to the respective tap chamber whose contacts are to be monitored. An index n is set at zero at 2. The system is thereby enabled. A start impulse is provided at 3. In addition, the actual tap changer setting is determined at 4 from a setting signaler 5. At this point the tap changer can be triggered by a switching pulse to drive the tap changer via a respective motor and transmission in the respective rotary position in a direction of a "higher" or "lower" setting thereof is obtained at 7, the incrementing being represented at 8.

Simultaneously, the load current $J_L$ is measured at 9. In addition, the corresponding nominal tap voltage in the actual position is read out from the nonvolatile memory. At the same time, a determination is made as to the direction in which the tap change is effected and both the new tap changer setting as well as the previous tap changer setting are determined.

The nominal tap changer voltage is read from memory at 10 and the direction decision is shown at 11. The new and old setting are determined at 12 and 13.

Thereafter and separately for the switching contact and the resistance contact the corresponding switching currents are calculated. The switching current in the contact $J_{sk}$ is given by the relationship:

$$J_{SK}=\frac{J_L}{ParSec}$$

The switching current for the resistance contacts $J_{wk}$ is then given by:

$$J_{WK}=\frac{U_S+J_L\cdot\frac{R_0}{s_{res}}}{2\cdot R_0}$$

These determinations are represented at block 14 in FIG. 1.

In these formulae, ParSec represents the number of parallel sectors of switching under load, i.e. the number of parallel contacts for each tap change. $U_s$ is the respective nominal tap voltage and $s_{res}$ represents the resulting current splitting. $R_ü$ is the magnitude of the bridging resistance.

From these values, the burnoff rates are calculated at 15. Various possibilities for this calculation have been described previously and in the drawing the burnoff rate for the switching contact $A_{sk}$ is determined from the relationship:

$$A_{sk}=a\cdot J_{sk}{}^b\cdot s$$

and the burnoff rate for the resistance contact in accordance with the relationship:

$$A_{wk}=a\cdot J_{wk}{}^b\cdot s$$

a and b are the factors previously described and s is the safety factor which here allows a flat rate to be determined.

The cumulative volume burnoff is then determined. Thus for the switching contacts and for the resistance contacts at each switching operation, for which a burnoff is determined by the computer and which can be summed to the total burnoff, the sum or cumulative burnoff is ascertained. The burnoff calculated for a current switch operationsi added to the sum of all previous burnoff and stsored as a new volumetric burnoff. The cumulated volume burnoff for the switch contact is given by:

$$GA_{SK}{}^n=GA_{SK}{}^{n-1}+A_{SK}$$

and the resistance contact by:

$$GA_{WK}{}^{n}=GA_{WK}{}^{n-1}+A_{WK}$$

The variable n is the aforementioned index which is incremented by 1 at each operation of the tap changer. The cumulative volume burnoff is obtained in mm$^3$ and the burnoff is calculated in mm of the contact thickness. For the switching contact one obtains $$GAd_{SK}^{n}=\frac{GA_{SK}^{n}}{F}\cdot k$$

and for the resistance contact $$GAd_{WK}^{n}=\frac{GA_{WK}^{n}}{F}\cdot k$$

F is the respective contact area of the corresponding contact while k is a switch-specific correction factor.

The burnoff value calculated in this manner thus represents the total cumulative burnoff for each contact in mm, i.e. the change in contact thickness from its state when new.

These values are then compared, in accordance with the invention with the previously stored limiting values from the nonvolatile memory and the computer can then test whether a corresponding percentage of the permissible burnoff of the contact has been reached or a certain percentage of the permissible burnoff difference between the burnoffs of the switching and resistance contacts has been reached, or whether either burnoff has reached a maximum permissible level requiring interchange of the contact replacement of the contact or other intervention. In all of these cases, warning signals can be generated or warning messages can be transmitted. Of course in cases in which the signal is to alert the operator to a potential need to change the contacts, the warning signal can be given at say 90% of the limiting value, i.e. before the last 10% of the permitted erosion of the contact occurs so that a visual inspection can be instituted.

When the measure is the permitted contact erosion difference between the erosions of the switching and the resistance contacts, the warning can be triggered before the threshold difference is reached so that the contact need not necessarily be replaced by new contacts but can simply be interchanged. Generally both approaches are used since after a number of interchanges, a maximum permissible wear of the contact may have been reached that requires replacement of both the switching and resistance contact.

Figure 2:
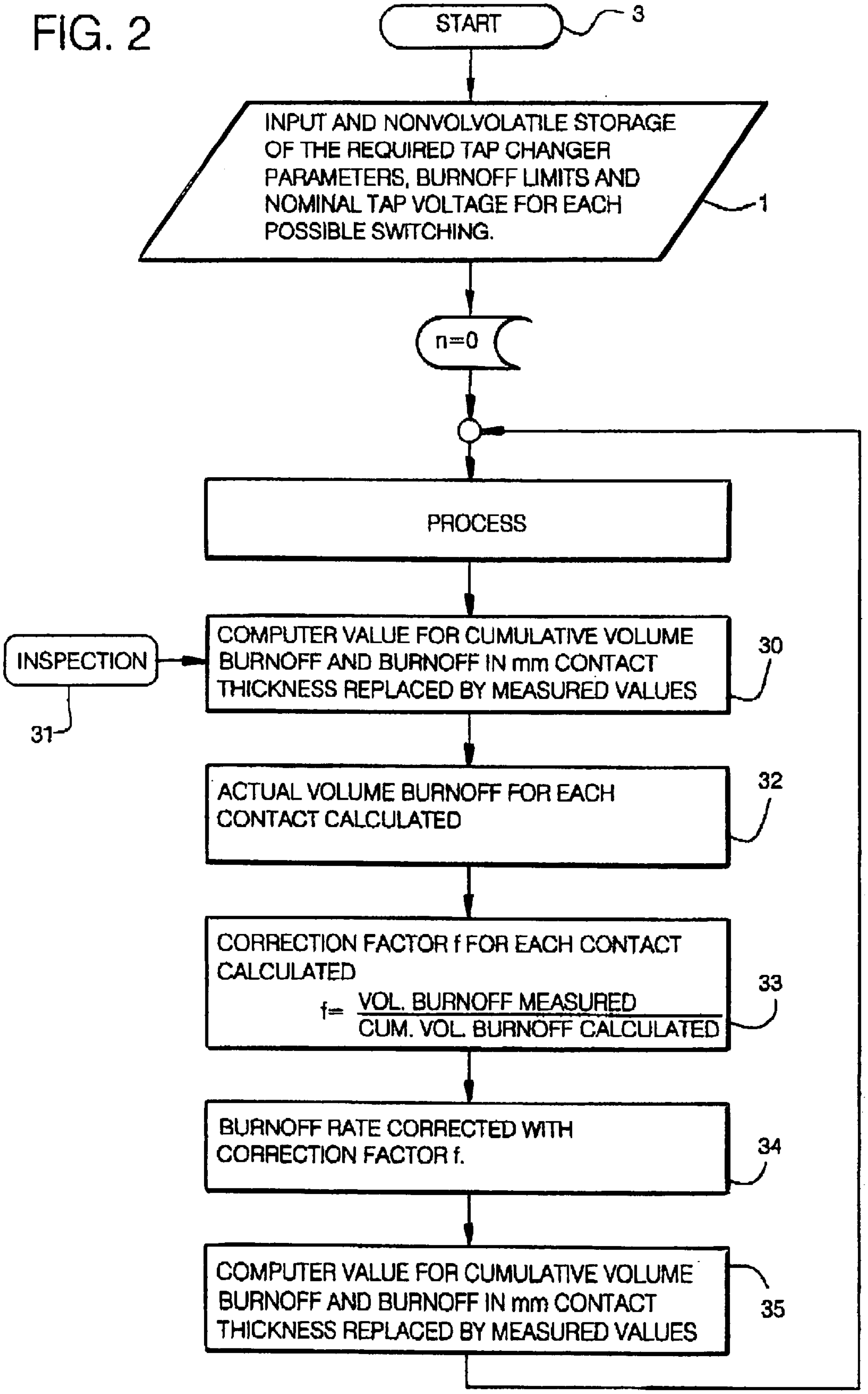
FIG. 2 is a similar diagram of another method within the scope of the present invention.

FIG. 2 shows a further development of the process of the invention and in FIG. 2 the portion of the process in FIG. 1 which is repeated in the algorithm of FIG. 2 is shown by the bracket identified as procedure 1. The method of FIG. 2 may include further process steps which can make the entire process self-learning.

It has previously been described that the contact burnoff is subjected to certain fluctuations that are covered by the safety factor f are taken into consideration in providing a flat safety factor. However, where precision of the burnoff calculation is to be increased so that the learning process more precisely can calculate the burnoff rate, after a certain repetitive number of operations of the tap changer, for example after 10,000 switchings per contact, the actual contact burnoff may be measured in terms of millimeters of contact thickness. This can be done as part of a routine inspection. From the measured values, the volume burnoff for each contact can be calculated and compared to the calculated volume burnoff of the contact by the computer method of the invention. The quotient $$f=\frac{Volume\ burnoff_{measured}}{Cumulative\ volume\ burnoff_{calculated}}$$

is then obtained and from that a correction factor is introduced into the calculation of the burnoff rate as follows:

$$\text{Burnoff}\left[\frac{\text{mm}^3}{\text{switching}}\right]=f\cdot a\cdot J^{b}\cdot s$$

or as: $A_{neu}=f\cdot A_{alt}$. In this manner corrected burnoff rates are obtained for each contact which are no longer exclusively dependent on the measurement of the switching current but also are determined by the correction factor f. At each inspection new correction factors f are obtained and further corrections are carried out in accordance with the following recursion:

$$A_i=f_i\cdot A_{i-1}.$$

In this recursive formula the index i depends on the number of inspections carried out, i.e. the number of actual measurements of the volume burnoff. The precision of the process is continuously improved and the system is self-learning.

The calculation of the cumulative volume burnoff in the process 1 in FIGS. 1 and 2 has been represented at 16 and it is followed by the storage of the calculated values cumulative volume burnoff in an external medium at 17. It is from these stored values that the burnoff in mm of contact thickness can be calculated at 18. The decision block 19 determines whether a particular percentage of the permissible contact burnoff has been reached or not and in the affirmative the warning signal is given at 20 and if necessary the calculation iteration is terminated. In either case a decision block 21 indicates that a percentage of the permissible burnoff difference is questioned and again in the affirmative the warning signal is given at 22 and the iteration is stopped. The iteration is repeated at 23 and returns to the higher or lower block 7.

Similarly in FIG. 2, following the start input at 3 and the input and nonvolatile storage of the necessary tap changer parameters, the burnoff limits or thresholds and the nominal tap voltage for each possible switching at 1, the algorithm runs through process 1 as has been described. Following the run through and prior to iteration, the burnoff measurement at all contacts can be determined at 30 following an actual expression 31 and the actual volume burnoff for each contact calculated at 32.

The correction factor f is then calculated as has been described at 33 and the correction factor used in recalculating the burnoff rate at 34. The computer determined cumulative volume burnoff and the burnoff in mm of contact thickness are replaced by the measured values at 35 and the process is repeated at 36.

We claim:

1. A method of monitoring contact burnoff in a tap changer for a transformer having a multiplicity of voltage taps, said method comprising the steps of:

(a) storing values of respective nominal tap voltages ($U_S$), a limiting value for the permissible contact burnoff for switching contacts and resistance contacts of the tap changer, and tap-changer-specific parameters a, b and k;

(b) detecting a current tap setting of the tap changer;

(c) incrementing an index n with each tap change by ($c_1$) stepping said tap changer to a selected tap, ($c_2$) measuring a respective load current ($J_L$) of the selected tap, and ($c_3$) reading out the permanently stored values for the nominal tap voltage ($U_S$) of said selected tap;

(d) calculating a switching current ($J_{SK}$) of the respective switching contacts and a switching current ($J_{WK}$) of the respective resistance contacts in accordance with the relationships:

$$J_{SK} = \frac{J_L}{ParSec}$$

$$J_{WK} = \frac{U_S + J_L \cdot \frac{R_0}{s_{res}}}{2 \cdot R_0}$$

wherein ParSec is a number of parallel sectors, $R_0$ is a magnitude of a bridging resistance of the tap changer for the selected tap and $s_{res}$ is a resulting current distribution;

(e) calculating the respective burnoff rates $A_{sk}$ of the respective switching contacts and $A_{wk}$ of the respective resistance contacts from the relationships:

$$A_{SK} = a \cdot J_{SK}^b$$

$$A_{WK} = a \cdot J_{WK}^b$$

(f) summing up the burnoff rates ($A_{sk}$) and ($A_{wk}$) to obtain total volume burnoffs ($GA_{SK}^n$)for the switching contacts and $GA_{WK}^n$ for the resistance contacts by the relationships:

$$GA_{wk}^n = GA_{wk}^{n-1} + A_{wk};$$

$$GA_{sk}^n = GA_{sk}^{n-1} + A_{sk};$$

(g) calculating the respective burnoffs in millimeters of contact thickness for the switching contacts ($GAd_{SK}^n$) and for the resistance contacts ($GAd_{WK}^n$) over the respective contact areas F by the relationships:

$$GAd_{SK}^n = \frac{GA_{SK}^n}{F} \cdot k$$

$$GAd_{WK}^n = \frac{GA_{WK}^n}{F} \cdot k;$$

and (h) comparing the values ($GAd_{SK}^n$) and ($GAd_{WK}^n$) with the permanently stored limits and generating a report upon overstepping of the permanently stored limit or a percentage thereof.

2. The method defined in claim 1 wherein the respective burnoff rates ($A_{sk}$) and ($A_{wk}$) are obtained from the calculated switching currents ($J_{SK}$) and ($J_{WK}$) in accordance with the relationships:

$$A_{SK} = a \cdot J_{SK}^b \cdot s, \text{ and}$$

$$A_{WK} = a \cdot J_{WK}^b \cdot s,$$

where s is a safety margin.

3. The method defined in claim 2 wherein an actual contact burnoff is measured after a large number of switchings and the corresponding actual volumetric contact burnoff is calculated to obtain a factor f by the relationship:

$$\frac{\text{volumetric burnoff}_{measured}}{\text{cumulative volumetric burnoff}_{calculated}} = f$$

and each respective burnoff rate is corrected in accordance with the relationship:

$$A_{new} = f \cdot A_{old},$$

whereby the respective corrected value ($A_{new}$) is then used for future calculations in said method.

4. The method defined in claim 1 wherein an actual contact burnoff is measured after a large number of switchings and the corresponding actual volumetric contact burnoff is calculated to obtain a factor f by the relationship:

$$\frac{\text{volumetric burnoff}_{measured}}{\text{cumulative volumetric burnoff}_{calculated}} = f$$

and each respective burnoff rate is corrected in accordance with the relationship:

$$A_{new} = f \cdot A_{old},$$

whereby the respective corrected value ($A_{new}$) is then used for future calculations in said method.

* * * * *